United States Patent

Huszar et al.

[11] Patent Number: 5,862,192
[45] Date of Patent: Jan. 19, 1999

[54] METHODS AND APPARATUS FOR EQUALIZATION AND DECODING OF DIGITAL COMMUNICATIONS CHANNELS USING ANTENNA DIVERSITY

[75] Inventors: Stephen Russell Huszar, Bridgewater; Nambirajan Seshadri, Chatham, both of N.J.

[73] Assignee: Lucent Technologies Inc., Murray Hill, N.J.

[21] Appl. No.: 580,218

[22] Filed: Dec. 28, 1995

Related U.S. Application Data

[63] Continuation-in-part of Ser. No. 398,400, Mar. 3, 1995, abandoned, which is a continuation of Ser. No. 816,510, Dec. 31, 1991, abandoned.

[51] Int. Cl.$^6$ .............................. H04B 7/08; H04L 1/02; H04L 27/06
[52] U.S. Cl. .......................... 375/347; 375/341; 375/262; 375/267
[58] Field of Search ...................... 375/341, 347, 375/348, 346, 340, 232, 262, 267; 371/43.8, 43.7

[56] References Cited

U.S. PATENT DOCUMENTS

| | | | |
|---|---|---|---|
| 4,745,625 | 5/1988 | Eyuboglu | 375/316 |
| 4,833,693 | 5/1989 | Eyuboglu | 375/254 |
| 4,847,871 | 7/1989 | Matsushita et al. | 375/341 |
| 4,862,483 | 8/1989 | Clark | 375/341 |
| 4,905,254 | 2/1990 | Bergmans | 375/233 |
| 5,005,188 | 4/1991 | Clark | 375/341 |
| 5,056,117 | 10/1991 | Gitlin et al. | 198/725 |
| 5,081,651 | 1/1992 | Kubo | 375/341 |
| 5,164,961 | 11/1992 | Gudmundson | 375/341 |
| 5,191,598 | 3/1993 | Bäckström et al. | 375/347 |
| 5,195,107 | 3/1993 | Wei | 375/341 |
| 5,257,272 | 10/1993 | Fredrickson | 371/43.4 |
| 5,263,033 | 11/1993 | Seshadri | 371/43.4 |
| 5,263,053 | 11/1993 | Wan et al. | 375/341 |
| 5,272,727 | 12/1993 | Okanoue | 375/341 |
| 5,481,572 | 1/1996 | Sköld et al. | 375/347 |
| 5,499,272 | 3/1996 | Bottomley | 375/347 |
| 5,577,068 | 11/1996 | Bottomley et al. | 375/348 |
| 5,621,769 | 4/1997 | Wan et al. | 375/349 |
| 5,774,504 | 6/1998 | Huszar et al. | 375/341 |

FOREIGN PATENT DOCUMENTS

| | | |
|---|---|---|
| 0 436 101 A3 | 11/1990 | European Pat. Off. . |
| 0 453 814 A2 | 3/1991 | European Pat. Off. . |

*Primary Examiner*—Stephen Chin
*Assistant Examiner*—Betsy L. Deppe

[57] ABSTRACT

An equalizer/decoder for a communication channel presenting impairments to error-free reception of transmitted symbols includes a modified Viterbi decoder operating on samples of received signals in a plurality of equivalent subchannels. Estimates of each of the subchannels are updated using a locally best estimate in the Viterbi trellis processing, thereby avoiding delay in updating channel estimates in a rapidly changing channel such as a digital cellular communications channels. A leaky predictor channel updating technique also proves advantageous in an alternative embodiment.

28 Claims, 12 Drawing Sheets

METHODS AND APPARATUS FOR EQUALIZATION AND DECODING OF DIGITAL COMMUNICATIONS CHANNELS USING ANTENNA DIVERSITY

The present application is a continuation-in-part of U.S. patent application Ser. No. 08/398,400 filed Mar. 3, 1995, now abandoned, which is a continuation of U.S. patent application Ser. No. 07/816,510 filed Dec. 31, 1991, now abandoned.

CROSS REFERENCE TO RELATED APPLICATIONS

This application is related to U.S. Pat. Nos. 5,208,816 and 5,263,033 both of which are hereby incorporated by reference in the present disclosure. A further related case is U.S. Pat. No. 5,774,504.

FIELD OF THE INVENTION

This invention relates to the mitigation of communication channel impairments, and more particularly to methods and apparatus for equalization and decoding of digital communications channels using antenna diversity.

BACKGROUND OF THE INVENTION

Transmission of digital information over communication channels has been extensively studied. See, for example, A. J. Viterbi and J. K. Omura, *Principles of Digital Communications and Coding*, McGraw-Hill, New York, 1979. Among the many techniques developed to improve the speed and accuracy of digital communication have been those used for compensating for the distortion present in many such channels. An important set of such techniques are those for equalization of delay distortion and intersymbol interference.

A variety of techniques have long been used in equalizing relatively constant communication channels and adapting to changes that occur in the transmission characteristics of transmission channels due to changes in environmental and other circumstances. See, for example, J. G. Proakis, *Digital Communications*, McGraw-Hill, New York, 1989; and S. U. H. Qureshi, "Adaptive Equalization," *Proceedings of the IEEE*, Vol. 73, pp. 1349–1387, September, 1985. An important class of such techniques use non-linear equalizers such as decision feedback equalizers with adaptation logic to track slow variations in a channel after an initial learning phase. In this mode, it is assumed that the output of a decoder is correct with high probability. Error signals based on these output signals are then used to update the coefficients of the equalizer. Decision feedback techniques are generally described, for example, in A. Duel-Hallen and C. Heegard, "Delayed Decision-Feedback Sequence Estimation," *IEEE Transactions on Communications*, Vol. COM-37, pp. 428–436, May, 1989.

Recently, interim (non-final) decisions in delayed-decision (Viterbi-like) decoders have been used to adjust coefficients characterizing equalizers used in data communications. Such equalizers, including so-called blind equalizers using little or no training, are described in U.S. Pat. No. 5,263,033 which is assigned to the assignee of the present invention.

Many communication channels, including cellular telephone channels, exhibit rapid changes in transmission characteristics, thereby causing great difficulty in adaptively equalizing such channels. Digital cellular systems are currently implemented in some countries, and a new proposal has been made for standards for a new digital cellular communication system in the United States. See, "Cellular System," Report IS-54, by the Electronic Industries Association (EIA), December, 1989. In the sequel, this proposal will be referred to as the "IS-54 standard" and systems of the type described therein as the "IS-54 system."

When equalizing a mobile (cellular) radio channel such as those employing IS-54 systems, fast adaptation is required, especially at high vehicle speeds. Such channels are typically characterized by Rayleigh fading, Doppler effects and delay spread. Prior art equalization techniques have been found lacking in mitigating the effects of such rapidly changing channel conditions.

While the prior art adaptive Viterbi Algorithm uses the globally best estimates of the transmitted data to update the estimates of the channel impulse response, processing used to develop these estimates necessarily introduces considerable complexity and delay. In a rapidly changing channel environment, the channel estimates so obtained may no longer be sufficiently accurate for currently processed symbols.

The present invention avoids the limitations of the prior art and provides a technical advance in permitting rapid adaptive equalization of digital cellular communication channels and other channels, including those exhibiting such fast-changing characteristics.

SUMMARY OF THE INVENTION

It proves convenient to group information symbols occurring at rate 1/T into sequences (e.g., having 130 symbols per sequence) at a transmitter for transmission over a communication channel and subsequent equalization/decoding at a receiver. Modulation techniques are used to match the information sequences to the transmission channel; such modulation is removed at a receiver by a demodulation technique appropriate to the type of modulation. The resulting baseband signal then represents the transmitted sequence, albeit in distorted form due to the effects of the channel and other processing.

In part because fading cellular communication channels exhibit spectral nulls, illustrative embodiments of the present invention advantageously employ decision-directed techniques in providing channel equalization. More particularly, illustrative embodiments of the present invention use a modified trellis structure related to that used in the well-known Viterbi decoding algorithm to perform decoding and equalization operations.

In anticipation of equalization and decoding, however, the received baseband signal is, in accordance with an aspect of the present invention, advantageously sampled at a rate equal to a multiple, R, of the transmitted symbol repetition rate, 1/T. The resulting sampled sequence is then decimated in time to produce R subsequences, each having a sample rate of 1/T. The first subsequence includes samples 1, R+1, 2R+1, . . . from the original sampled sequence; the second sequence includes samples 2, R+2, 2R+2, . . . from the original sampled sequence, and so forth.

In accordance with an aspect of the present invention, each of the R sampled sequences is advantageously compared with a locally generated signal representing the result of the passage of a current symbol and a predetermined number of past symbols through corresponding subchannels, each having respective estimated channel characteristics. Interim and final decisions about the symbols and the sequence actually transmitted are then made based on combined error values derived from the comparisons.

Another aspect of the present invention mitigates the effect of rapidly changing channel characteristics. In typical embodiment, the present invention advantageously employs a channel impulse response tracking algorithm using a "zero-delay" update algorithm based on more than one locally best estimate and typically as many as the number of states of the transmitted data sequence. Each local estimate typically comprises R subchannel estimates for use with the modified Viterbi algorithm. The zero-delay updating is based on these locally best estimates of the data sequence for each symbol interval.

Also useful in alternative embodiments of the present invention is a so-called leaky channel predictor for estimating channel characteristics that enhances error performance, especially at high vehicle speeds illustrative in a cellular system.

These and other aspects of the present invention are further illustrated in a space diversity receiving station in a mobile communication system. Using a plurality of receiver antennas, the station advantageously uses the subchannel and zero-delay updating techniques summarized above to achieve improved reception, even for rapid, deep fading signals.

BRIEF DESCRIPTION OF THE DRAWINGS

These and other aspects of the present invention will be described in the detailed description presented below in connection with the included drawing wherein.

DETAILED DESCRIPTION

To avoid unnecessary repetition of background and context information, U.S. Pat. No. 5,208,816 and 5,263,033 are hereby incorporated by reference in the present disclosure. Additional background material relating to cellular communications systems will be found in the above-referenced EIA IS-54 standard document.

While the present disclosure will proceed largely in terms of algorithms and processes, as will be best understood by those skilled in the art, it proves convenient to implement such processes and algorithms, in typical embodiments, in mobile and base station systems using special or general purpose processors under the control of stored programs. Typical of general purpose processors useful in implementing the teachings of the present invention is the AT&T DSP-16 family of digital signal processors.

Particular aspects of the functionality to be described below may also be implemented using standard special purpose digital circuits such as memory, comparators, analog-to-digital and digital-to-analog converters. The system described in the IS-54 document will be used as a typical application context for the present invention.

Overall Communication System

Figure 1:
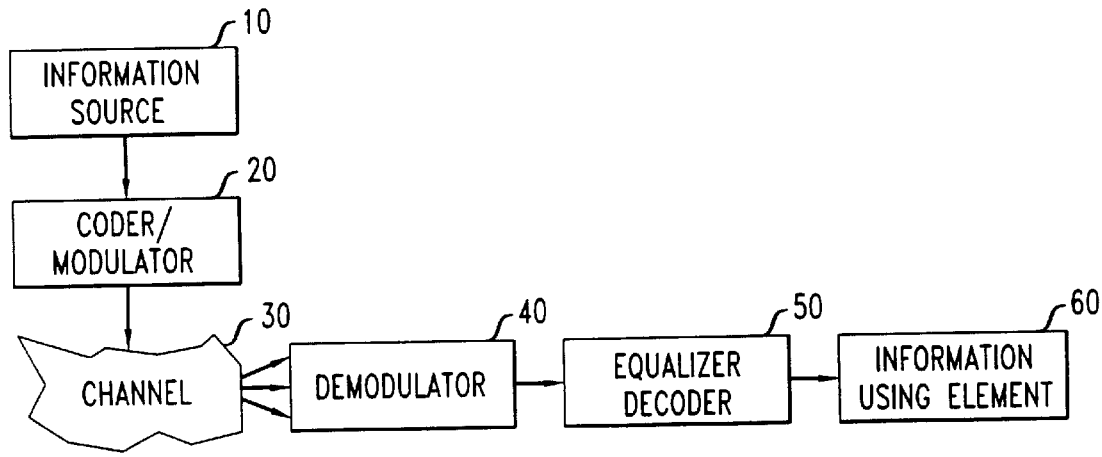
FIG. 1 is a block diagram representation of a communication system employing the present invention.

FIG. 1 shows an overall block diagram representation of a system employing the present invention. Shown there is an information source 10, which in the case of the IS-54 system might be a voice or data source. Typically, a voice input will be sampled in source 10 to produce a data sequence of binary or other digitally coded signals. Other standard processing, including matching of source sequence signals to channel 30 are represented by coder/modulator 20. Channel 30 is illustratively a multipath, fading channel encountered in digital cellular communication systems.

As will be described in more detail below, signals received from channel 30 are processed first by those receiver elements which produce sampled information represented by demodulator block 40 in FIG. 1. Equalizer/decoder 50 further processes the received demodulated sampled information to form estimates of the symbols actually transmitted into channel 30. Equalizer/decoder 50 will be described in greater detail below. Finally, the symbol estimates are provided to an information using element 60, which illustratively includes digital to analog conversion processing when the original source signals are analog voice signals.

Figure 2:
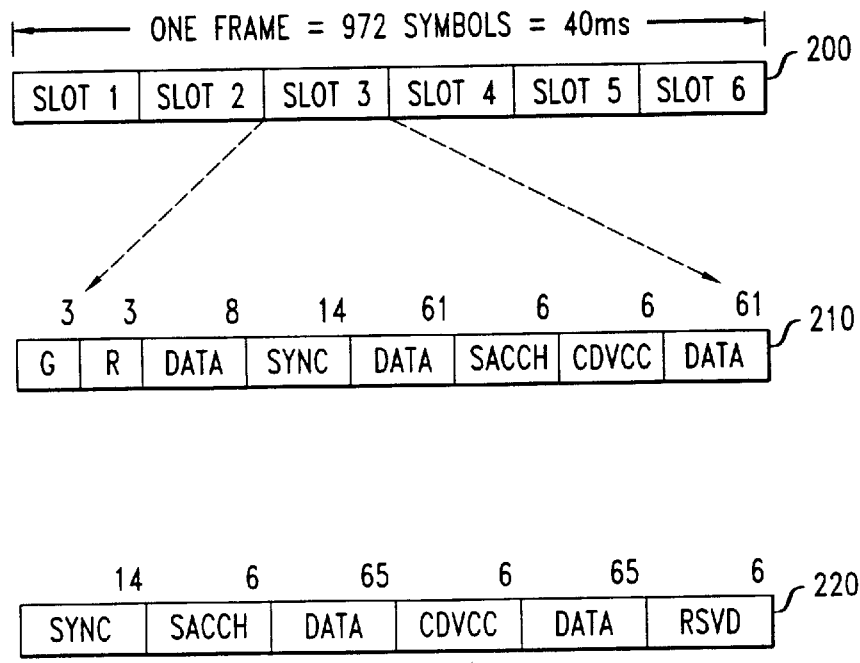
FIG. 2 shows slot formats for typical mobile to base station and base station to mobile unit communication in a digital cellular communication system.

The system of FIG. 1 advantageously groups information to be transmitted into channel frames such as 200 in FIG. 2. There, the channel frame format of the IS-54 standard is shown, with 6 time slots in each channel frame. In accordance with the IS-54 standard, each frame has a duration of 40 milliseconds (msec), with 972 differential quadrature phase shift keying (QPSK) signals transmitted in each such frame.

Each input speech signal communication in the illustrative system occupies two of the six time slots (1 and 4, 2 and 5 or 3 and 6). The speech coder included in coder/modulator 20 in FIG. 1 is advantageously a block encoder which digitizes speech occurring over consecutive 20 msec input periods and, after generating and adding error control bits, typically yields a total of 260 bits to represent the speech over each 20 msec input interval. These 260 bits are then transmitted over channel 30 in FIG. 1 in one of the time slots, such as time slot 3 in frame 200 in FIG. 2.

Each of these time division multiplex slots has a duration of 6.66 msec and, for the case of a mobile-station-to-base-station communication, includes the fields shown in greater detail in 210 in FIG. 2. A somewhat different pattern of symbols is used in the case of a base-station-to-mobile-station communication, as shown by the expanded time slot 220 in FIG. 2. These symbol fields include information used for synchronization, training and control. More particularly, the field labels shown in time slots 210 and 220 have the following meaning:

G Guard Time

R Ramp Time

SACCH Slow Associated Control Channel

SYNC Synchronization and Training Word

DATA User Information or FACCH

CDVCC Coded Digital Verification Color Code

RSVD Reserved

Digital Modulation Scheme

Figure 3:
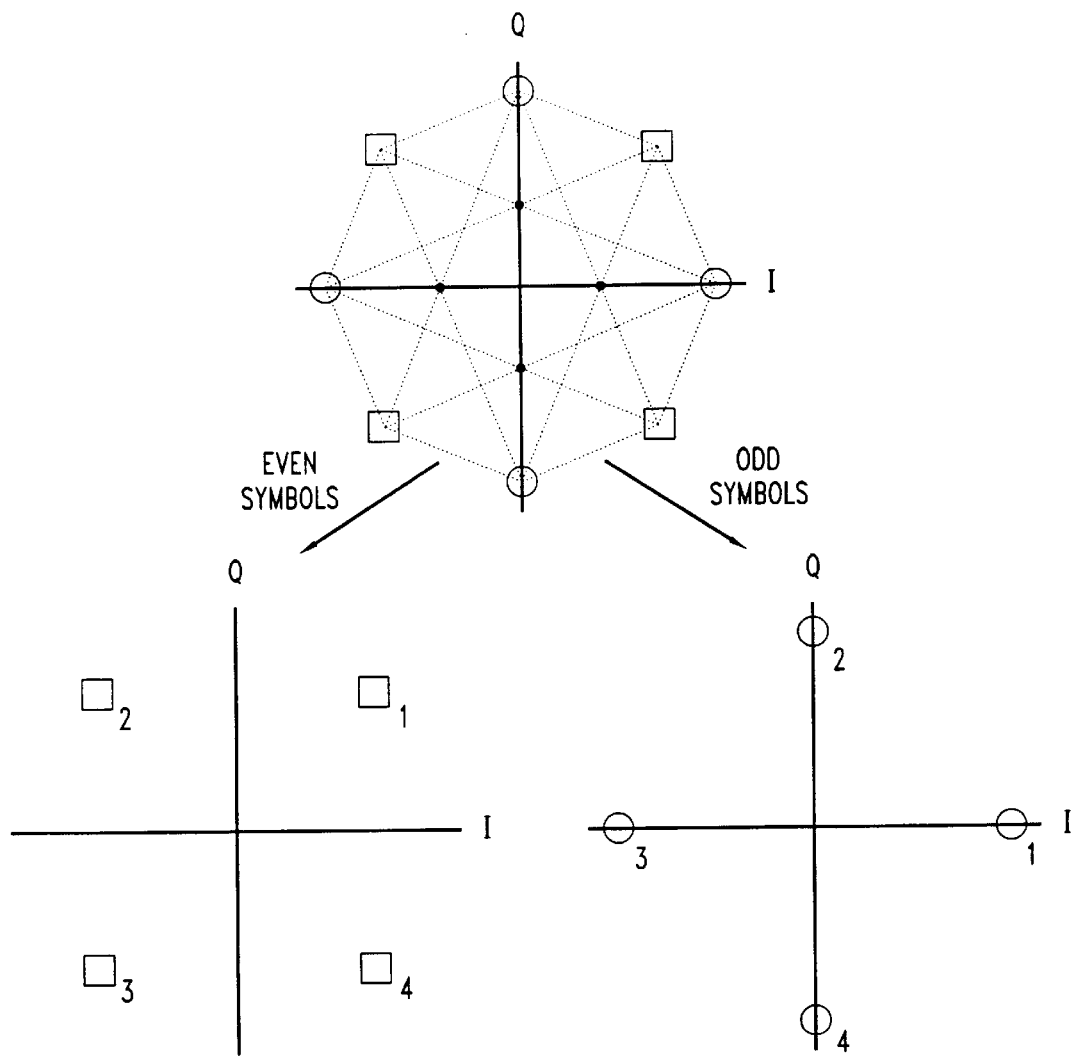
FIG. 3 shows phase assignments for symbols in a DQPSK modulation arrangement for use in a communication system.
Figure 4:
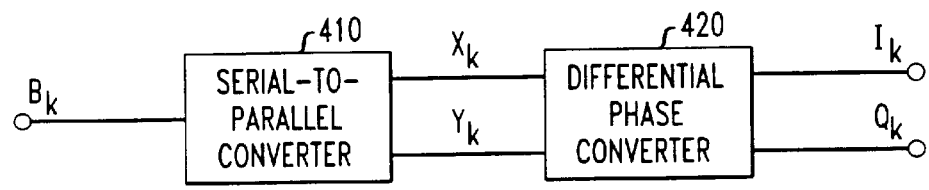
FIG. 4 shows a differential encoder that may be used in conjunction with the present invention.

The digital modulation method chosen for the U.S. digital cellular system IS-54 system is a modified version of differential four phase shift keying scheme with differentially coherent detection, known as π/4 shifted DQPSK or π/4-DQPSK (π/4-4DPSK) for short. Every second symbol is rotated by π/4 radians. Another way of expressing this is that from an eight-phase PSK (8PSK) signal point constellation, a 4PSK constellation (denoted ●) is selected for one during even symbol times and the remaining 4PSK constellation (rotated π/4) (denoted ■) is selected for use during odd symbol times as illustrated in FIG. 3. This results in a somewhat more constant envelope, especially by avoiding signal transitions through the origin. The illustrative modulation scheme uses the Gray coded phase constellation as shown in Table 1. Since the most probable errors due to noise result in the erroneous selection of an adjacent phase, most symbol errors contain only a single bit error. The information is advantageously differentially encoded. Thus the symbols are transmitted as changes in phase rather than absolute phases. A block diagram showing the use of the differential encoder is shown in FIG. 4.

The binary data stream, $B_k$, entering the modulator is converted by a serial-to-parallel converter 410 into two separate binary streams $(X_k)$ and $(Y_k)$. Starting with the first bit, bit 1, of stream $B_k$, all odd numbered bits form stream $X_k$ and all even numbered bits form stream $Y_k$. The digital data sequences $(X_k)$ and $(Y_k)$ are encoded by differential phase coder 420 onto $(I_k)$ and $(Q_k)$ according to $$I_k = I_{k-1} \cos [\Delta\Phi_k(X_k, Y_k)] - Q_{k-1} \sin [\Delta\Phi_k(X_k, Y_k)]$$

and $$Q_k = I_{k-1} \sin [\Delta\Phi_k(X_k, Y_k)] - Q_{k-1} \cos [\Delta\Phi_k(X_k, Y_k)], \quad (1)$$

where $I_{k-1}$, $Q_{k-1}$ are the amplitudes at the previous pulse time. The phase change $\Delta\Phi_k$ is determined according to the following Gray code table

| $X_k$ | $Y_k$ | $\Delta\Phi_k$ |
|---|---|---|
| 1 | 1 | $\frac{-3\pi}{4}$ |
| 0 | 1 | $\frac{3\pi}{4}$ |
| 0 | 0 | $\frac{\pi}{4}$ |
| 1 | 0 | $\frac{-\pi}{4}$ |

The signals $I_k$, $Q_k$ at the output of the differential phase encoding block can take the values 0, ±1, ±1/√2, resulting in the 8 point constellation shown in FIG. 3. Impulses $I_k$, $Q_k$ are applied to the inputs of I & Q base-band filters 510 and 520 shown in FIG. 5. The base-band filters used in the illustrative system typically have linear phase and square root raised cosine frequency response with a roll-off factor of 0.35, as is described more completely in the IS-54 document.

Figure 5:
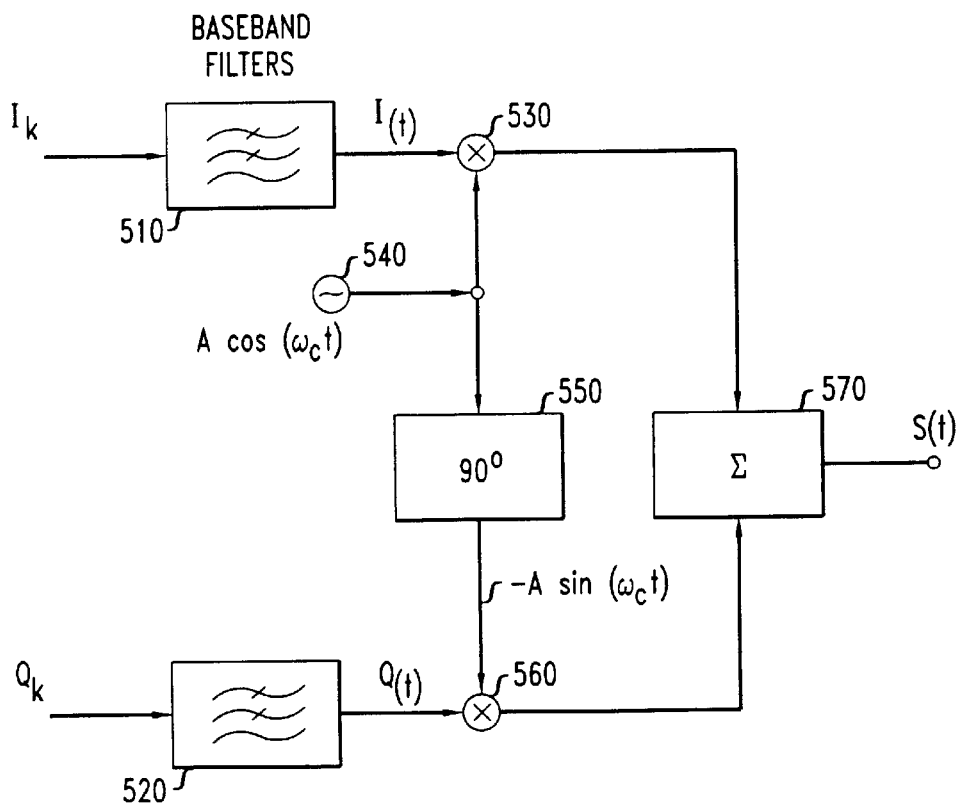
FIG. 5 shows a typical modulator for use with the present invention.

FIG. 5 shows a typical implementation of the modulator included in coder/modulator 20 in FIG. 1. After filtering by filters 510 and 520, the inputs are applied through multipliers 530 and 560 to signal source 540 and phase shifter 550 before being combined in summer 570 to produce s(t). The resultant transmitted signal s(t) is given by $$s(t) = \sum_n g(t - nT)\cos\Phi_n\cos\omega_c t - \sum_n g(t - nT)\sin\Phi_n\sin\omega_c t \quad (2)$$

where g(t) is the pulse shaping function, $\omega_c$ is the radian carrier frequency, T is the symbol period, and $\Phi_n$ is the absolute phase corresponding to symbol interval number n. The $\Phi_n$ which results from the differential encoding is: $\Phi_n = \Phi_{n-1} + \Delta\Phi_n$. With the complex symbol $c_n = \cos \phi_n + j \sin \phi_n$, i.e., even values of n, the $c_n$'s are drawn from the QPSK constellation (marked by ● in FIG. 3) and for odd intervals, they are drawn from the π/4 shifted QPSK constellation (marked by ■) in FIG. 3. The IS-54 document will provide further guidance respecting the illustrative modulation scheme described above.

Fading Channel Model

Figure 6:
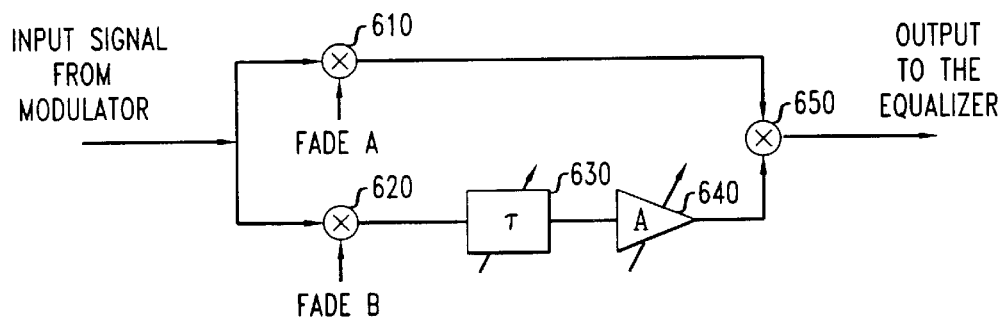
FIG. 6 shows a two-ray channel model for use with the present invention.

It proves convenient for purposes of analysis and to facilitate an understanding of the present invention, to adopt a standard two ray model for the frequency selective fading channel 30 in FIG. 1. This model is shown more completely in FIG. 6, which shows an input signal from a modulator, multipliers 610 and 620, FADE A and FADE B signals, variable delay τ630, variable attenuator 640, and summer 650 which produce an output to the equalizer. The model is generally representative of a broad range of channels encountered in actual practice and should not be interpreted as a limitation on the applicability of the present invention. The impulse response of such a two ray channel model is given by $$f(t) = a(t) \delta(t) + Ab(t) \delta(t-\tau), \quad (3)$$

where a(t) and b(t) are narrow-band Gaussian process, and τ is an arbitrary but fixed delay. The parameter A is an attenuation factor that determines the strength of the second ray. For illustrative purposes only, the attenuation factor, A, is set to unity. The narrow-band Gaussian processes are substantially equivalent to those that are generated by filtering independent white Gaussian processes. Consistent with results observed in actual practice, the fade is assumed to be constant over one symbol. The amplitude of the fades a(t) and b(t) are distributed according to normalized Rayleigh distribution function which is given by $$p(x)=2x\ e^{-x^2}. \tag{4}$$

For typical channels, such as those encountered in cellular communication systems, the phase of the Rayleigh fading is equally distributed between $(-\pi,\pi)$ and the autocorrelation of each discrete fade process satisfies $$R_n(\tau)=J_0(2\ \pi f_g \tau) \tag{5}$$

where $f_g$ is the Doppler frequency given by $$f_g=v/\lambda, \tag{6}$$

where v is the vehicle speed in meters/s and $\lambda$ is the transmission wavelength in meters.

Baseband Channel

Figure 7:
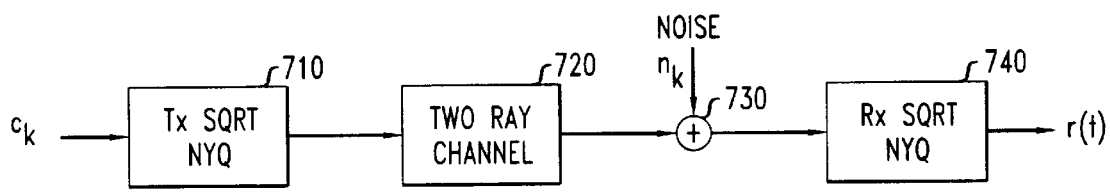
FIG. 7 shows the overall combination of receive and transmit filters with the channel exhibiting additive noise.

The received signal, after coherent demodulation and receive filtering by demodulator 40 in FIG. 1, is given by $$r(t) = \sum_{n=-\infty}^{+\infty} c_n h(t-nT) + n(t), \tag{7}$$

where $C_n=I_n+J\ Q_n$ is the differential modulator output at the $n^{th}$ symbol interval. The baseband channel impulse response h(t) is given by convolution relationship $$h(t)=g(t) \oplus f(t) \oplus g(t), \tag{8}$$

where g(t) is the typically square-root Nyquist, transmit filter, f(t) is the baseband impulse response of the transmission medium and q(t) is the baseband impulse response of the receiver filter. The noise, n(t), is additive Gaussian noise with power spectral density $$N(f)=N_0|Q(f)|^2, \tag{9}$$

where Q(f) is the frequency response of the receiver filter. A representation of the entire baseband transmission channel of the system of FIG. 1 is shown in FIG. 7, input $c_k$, Tx SQRT NYQ block 710, two ray channel 720, adder 730 and Rx SQRT NYQ block 740 which produces output r(t).

DECODING

The problem of decoding involves use of the received baseband signal r(t) (the output of receiver filter 740 in FIG. 7 prior to sampling) to find that modulator output sequence $c=\{\ldots, c_{-1}, c_0, c_1, \ldots\}$ and hence the corresponding modulator input sequence $\{B_k\}$ which minimizes $$\int_{-\infty}^{+\infty} [r(t) - \Sigma c_n h(t-nT)]^2 dt. \tag{10}$$

In appropriate cases, a different particular error criterion may, of course, be used. Instead of solving Eq. (10) directly, it proves convenient to solve what may be viewed as a numerical approximation to Eq. (10).

First, the received signal, r(t), is sampled at an integer multiple R of the baud rate. Then, the sampled received signal during the $i^{th}$ symbol interval is given by $$r_i(l)=r((i+l/R)T),\ 0 \le l \le R-1, \tag{11}$$

where, as before, T is the symbol period.

Figure 8:
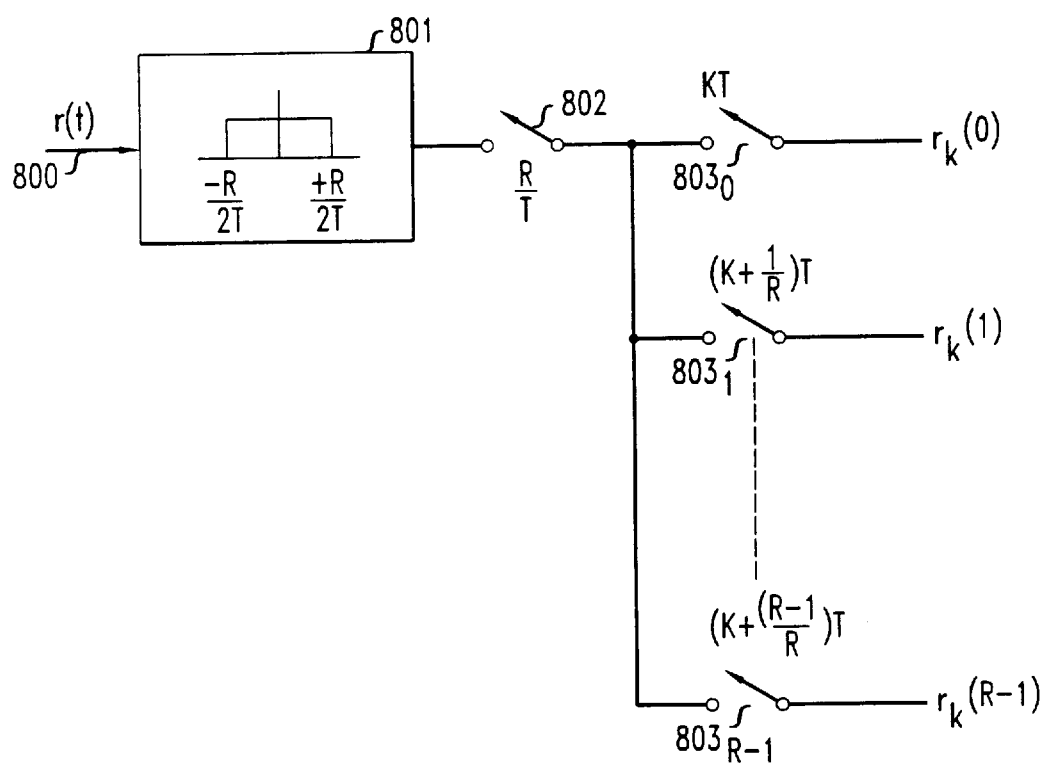
FIG. 8 shows a representation of a circuit for generating subsequences corresponding to the sampled demodulated signal received from the channel prior to decoding.

FIG. 8 shows a circuit arrangement for generating R sequences $r_k(l)$, l=0,1, . . . , R−1. In that circuit, the received signal r(t) appearing on input 800 is advantageously applied first to a bandpass filter 801 illustratively having bandwidth R/2T to filter any extraneous high frequency components. The filtered signal is then sampled at the rate R/T by sampler 802 and distributed to the R additional samplers 803$_l$. The first of these additional samplers, 803$_0$, selects the initial (indexed as the zeroth) sample produced by sampler 802 during each T-second interval, while the next sampler, 803$_1$, selects the second sample (indexed as sample 1) produced by sampler 802 during each T-second interval. Similarly, each of the samplers 803$_l$ selects the (l-1)th sample produced by sampler 802 during each T-second interval. This processing permits Eq. (11) to be interpreted as characterizing a set of R interleaved sample streams, each sampled at the baud rate, 1/T. Similarly, the channel response is defined as $$h_i(l)=h((i+l/R)T),\ 0 \le l \le R-1, \tag{12}$$

Then, Eqs. (7), (11) and (12) give $$r_i(l) = \sum_{n=-\infty}^{+\infty} c_{i-n} h_n(l) + n_i(l). \tag{13}$$

Thus, the overall sampled channel of FIG. 7 can be viewed as R sub-channels, with each sub-channel clock offset from its neighbor by T/R, and with each sub-channel being driven by a sequence of data symbols occurring at the baud rate, 1/T.

Figure 9:
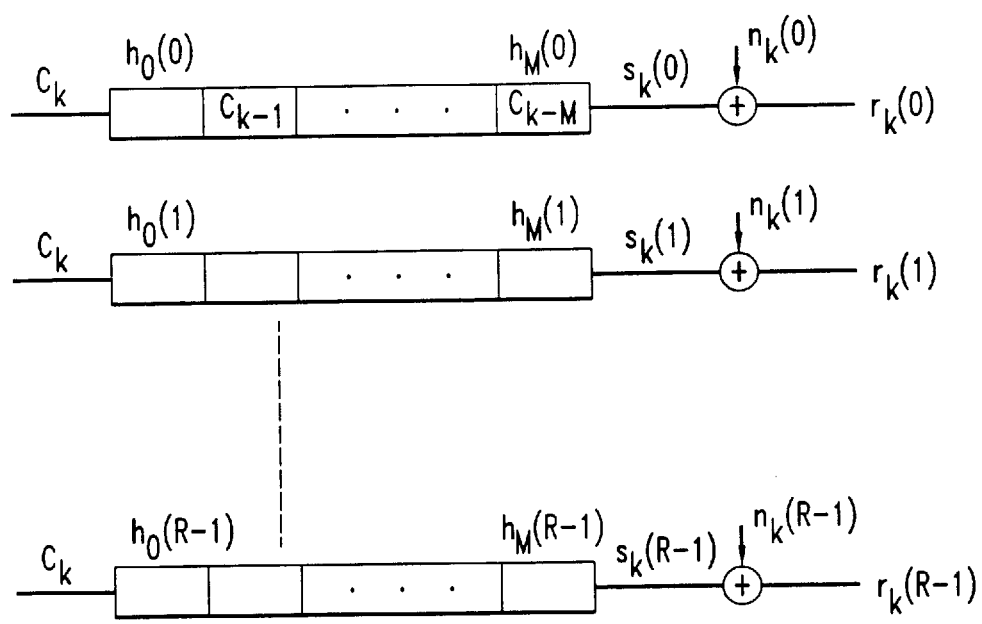
FIG. 9 shows the data sequence being processed through corresponding subchannels of the overall channel shown in FIG. 7 to generate noiseless channel subsequences.

FIG. 9 shows a representation of an overall channel including R subchannels in accordance with the method described above. At each instant, the input to a subchannel is the data symbol $c_k$. The output of subchannel l is $r_k(l)$, l=0, 1, 2,−(R−1).

Figure 10:
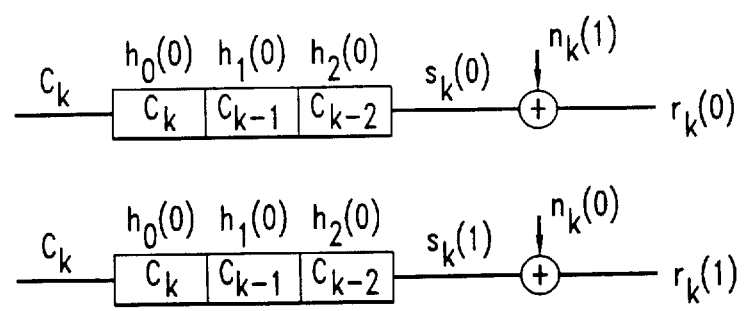
FIG. 10 shows a particularization of the arrangement of FIG. 9 for the typical case of two subchannels, each of which is illustratively characterized by three estimated channel coefficients.

FIG. 10 shows a particularization of the channel of FIG. 9 for the case of two subchannels that is helpful in the further description of the present invention. The T-second-spaced impulse response samples for each of the two subchannels in FIG. 10 illustratively span three data symbols, i.e., the current symbol and the two preceding symbols. Thus, for the subchannel corresponding to the first half of a T-second period, the sampled impulse response is $$h(0)=\{h_0(0), h_1(0), h_2(0)\}. \tag{14}$$

The sampled impulse response for the other T-spaced subchannel (having a time offset of T/2 from that characterized by Eq. 14) is $$h(1)=\{h_0(1), h_1(1), h_2(1)\}. \tag{15}$$

The two sampled outputs of the illustrative channel during the $K^{th}$ time interval in absence of noise are given by $$s_k(0) = \sum_{i=0}^{2} c_{k-i} h_i(0), \tag{16}$$

and $$s_k(1) = \sum_{i=0}^{2} c_{k-i} h_i(1).$$

The problem of decoding then resolves to finding modulator output sequence $c=(c_{-n}, \ldots, c_{-1}, c_0, c_1, \ldots, c_n \ldots)$ such that the overall metric, J, where $$J = \sum_{k=-\infty}^{+\infty} \|s_k(0) - r_k(0)\|^2 + \|s_k(1) - r_k(1)\|^2 \tag{17}$$

is minimized.

Trellis Decoding Algorithm

Because of the characteristics of typical communications channels noted above, the output from the overall composite channel of FIG. 7 (including all subchannels represented in FIGS. 9 and 10), during the time interval (kT, kT+T) is determined by a "current" input $C_k$ and previous inputs $C_k = (C_{k-1}, \ldots, C_{k-M})$. This M-length vector $c_k$ is representative of the state of channel inputs contributing to a current channel output. In FIG. 10 and Eqs. 14–16, each subchannel output is indicated as being affected by symbols transmitted in two intervals prior to the interval corresponding to the "current" symbol, i.e., M=2. For each input state, four transitions can occur, corresponding to the four DQPSK symbols in each symbol constellation. Associated with each state transition for the illustrative context of FIG. 10 are two channel signals $S_k(0)$ and $S_k(1)$ which are given by $$s_k(i) = \sum_{n=0}^{M} c_{k-n} h_n(i). \tag{18}$$

Since the transmitted data symbol in each input interval takes on one of 4 possible values, we can describe all possible channel states and outputs by a trellis with $4^M$ states for each T-second interval, with 4 branches entering and leaving each state. The data sequence that minimizes Eq. (17) can then be found in accordance with one aspect of the present invention using a variant of the well-known Viterbi algorithm. The decoding of received signals for the illustrative IS-54 system is, of course, subject to the constraint that the $C_k$'s in two adjacent intervals are drawn from two separate constellations, with a phase offset of $\pi/4$ between them.

Figure 11:
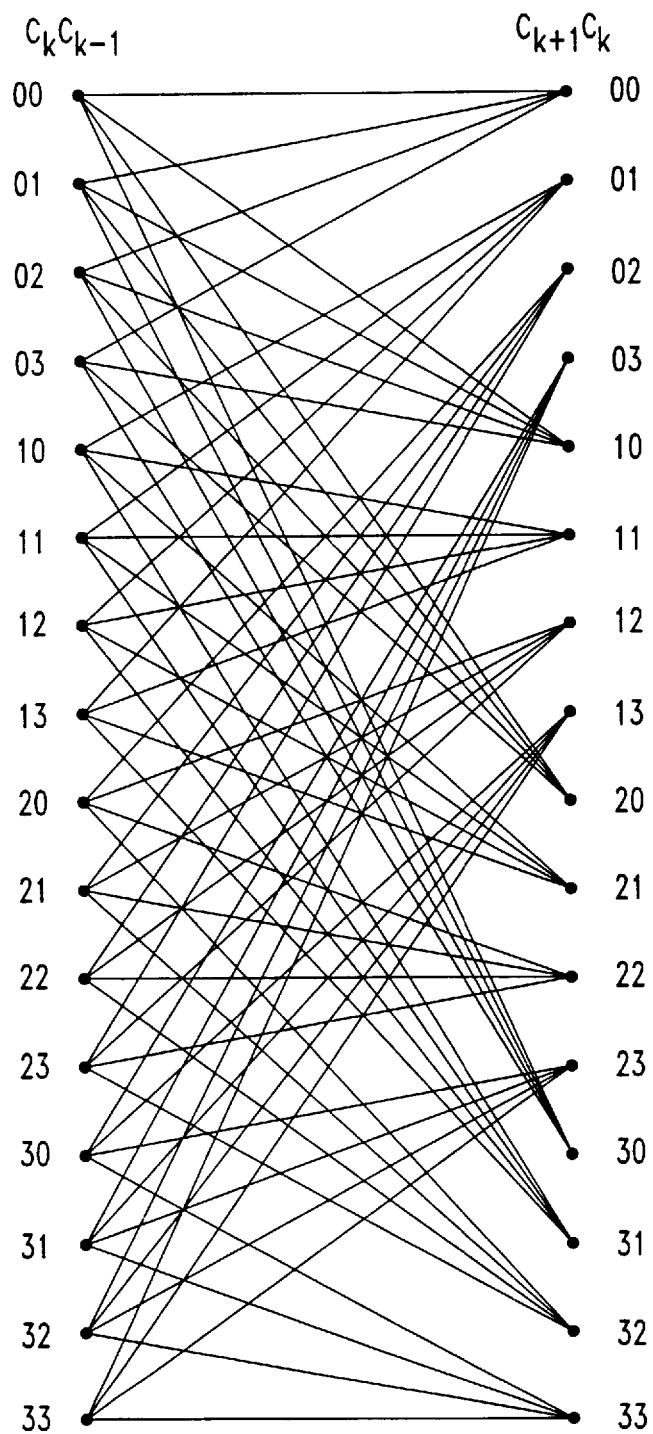
FIG. 11 shows a trellis diagram illustrating state changes for a communication system using a four-symbol constellation in each symbol interval and employing a channel with a two-symbol memory.

FIG. 11 shows a complete state transition diagram for the illustrative IS-54 system with two-symbol memory. Since M=2, each state comprises a symbol pair as described, e.g., in S. Benedetto, E. B. Biglieri and V. Castellani, "Digital Transmission Theory," Prentice Hall, Englewood Cliffs, 1987, especially chapter 7. With M=2 and with four possible symbols, there are therefore $4^2=16$ states.

In particular, FIG. 11 shows the transitions from states associated with the symbol pair $c_k c_{k-1}$ at time k to that for the symbol pair $c_{k+1} C_k$ at time k+1. In each case the symbols are assigned one of the values i=0, 1, 2, or 3 as a shorthand for the actual values for $c_i$, which are known to take one of 4 values $e^{j0}$, $e^{j\pi/2}$, $e^{j\pi}$, $e^{j3\pi/2}$, or $e^{j\pi/4}$, $e^{j3\pi/4}$, $e^{j5\pi/4}$, $e^{j7\pi/4}$ alternately in successive T-second symbol intervals for the illustrative IS-54 system.

The $l^{th}$ subchannel output for the illustrative case of two-symbol channel memory during a transition from state $c_k c_{k-1}$ at time k to state $c_{k+1} c_k$ at time k+1 is correspondingly given by Eq. (17). Each such transition has associated with it a cost or error metric of the form shown in Eq. (17).

As is well known in the art, the sequence of symbols corresponding to the path through the trellis having the minimum error-related cost or metric is advantageously chosen to be that actually transmitted. Difficulties in performing these metric evaluations include complexity arising from the number of paths for which metrics must be calculated and the accuracy and currency of the estimates of the channel impulse response samples.

Channel Adaptation Algorithm

Most prior equalizers used with time-varying channels, such as mobile radio channels, use estimates of sampled channel impulse response coefficients, h, based initially on a known training sequence sent from the transmitter. These initial channel coefficients are then typically updated in an on-going process using a decision-directed adaptation algorithm, such as the normalized LMS algorithm described in the 1989 book by Proakis cited above.

If the decoder decisions are given by $\tilde{c}_k$ at time k then, during the $k^{th}$ interval the channel update equation for the arrangement depicted in FIGS. 9 and 10 and described above is given by $$h_k^\dagger(l) + h_{k-1}^\dagger(l) + \Delta \cdot e_k(l) \cdot \tilde{c}_k^{*\dagger} \tag{19}$$

where $h_k(l)$ is the $l^{th}$ T-spaced channel impulse response estimate vector, i.e., $h_k(l) = (h_{0,k}(l), h_{1,k}(l), \ldots, h_{m,k}(l))$ during [kT, (k+1)T] where $h_{i,k}(l)$ is the $i^{th}$ channel coefficient of the $l^{th}$ T-spaced channel impulse response estimate during [kT, (k+1)T]. Here, $$\tilde{c}_k^* = (\tilde{c}_k^*, \tilde{c}_{k-1}^*, \ldots, \tilde{c}_{k-M}^*), \tag{20}$$

where '*' denotes the complex conjugate and † denotes the transpose. The symbol $\tilde{c}_k$ is the estimate of the transmitted data symbol during the interval [kT,(k+1)T]. The step size adjustment to the channel parameters, $\Delta$, is chosen to be a small quantity and is illustratively given by $$\Delta = \frac{1}{(M+1)P}, \tag{21}$$

where P is the average power in the transmitted symbol $C_n$. The $l^{th}$ sub-channel error $e_k(l)$ is given by $$e_k(l) = r_k(l) - \sum_{i=0}^{M} \tilde{c}_{k-1} h_{i,k}(l). \tag{22}$$

In practice, the Viterbi decoder releases decisions $\tilde{c}_k$ with a certain delay D. That is, in making decisions about $C_k$, the decoder also takes into account, the contributions of the data symbols up to time (k+D)T. In general, the decoder decisions are reliable when the decoding delay D is large. However, in a nonstationary environment such reliability cannot be assured. This is the case because the error $e_k(l)$, i>k, for the $l^{th}$ sub-channel is evaluated using the channel estimate at time (k-1)T and, for large D, the channel might have changed significantly during the evaluation period. Thus, the metric evaluation for the traditional Viterbi algorithm is potentially sub-optimal due to such channel mismatch, resulting in increased decoding error probability.

In accordance with an aspect of the present invention, tentative decisions that are obtained with a smaller decoding delay than required to make reliable final decisions are advantageously used for the purpose of channel updating. Typical choices of delay for channel updating and decoding have been obtained through experiments.

Improved Equalizer/Decoder

Figure 12:
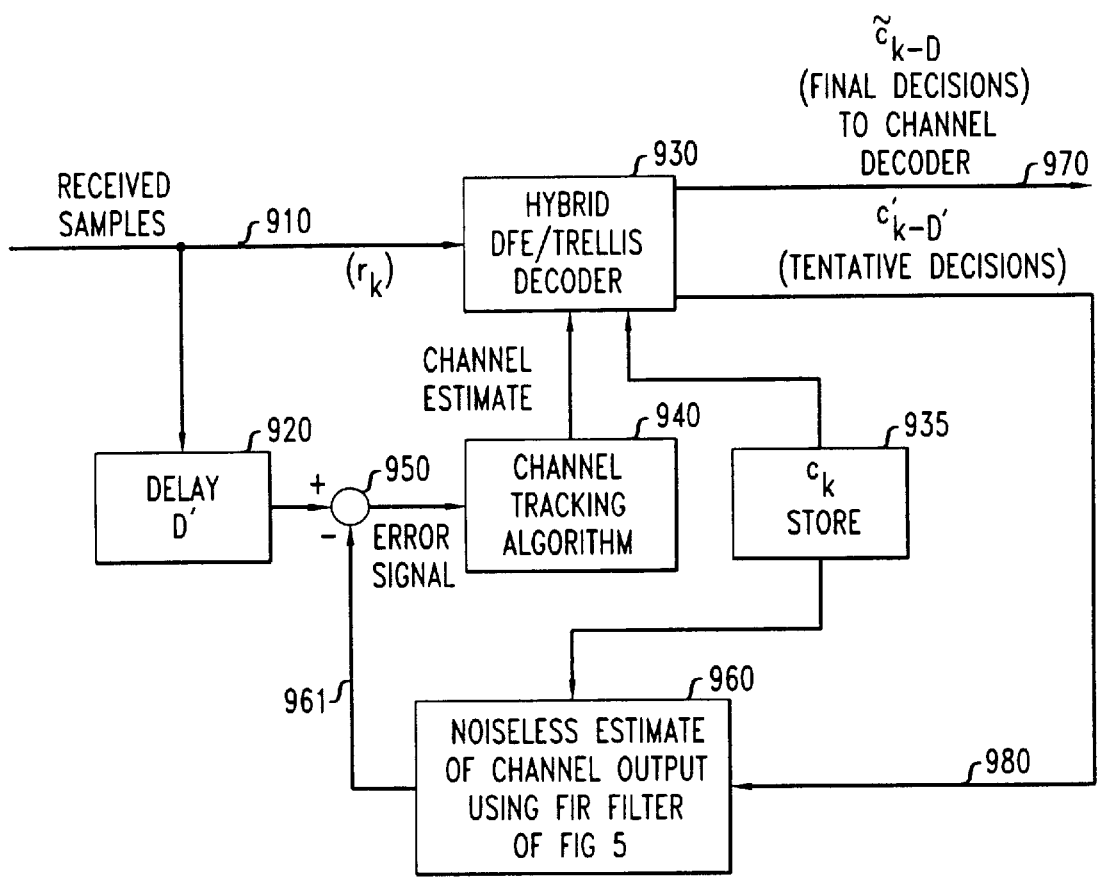
FIG. 12 is a functional diagram of an equalizer/decoder in accordance with an aspect of the present invention.

An equalizer/decoder including an implementation of a modified (hybrid) Viterbi algorithm and enhanced channel adaptation algorithm in accordance with aspects of the present invention is shown in functional block form in FIG. 12. In the arrangement of FIG. 12, incoming samples arrive on input 910 where they are processed by the hybrid trellis decoder 930 in a manner detailed below. The outputs on lead 970 from decoder 930 are the final decisions as to what symbols $C_k$ were sent from the modulator at the transmitting location.

Also appearing as outputs from decoder 930 are tentative decisions made during the modified Viterbi decoding process, which tentative decisions are used not as final decoder outputs, but in forming good short term estimates of transmitted symbols to be used for updating the channel coefficient. Thus short-term decisions appearing on output 980 are processed in estimating element 960 to form channel output decisions assuming noiseless transmission. In performing this function element 960 typically uses the finite impulse response (FIR) filter of FIG. 5. Thus, rather than using actual source sequence symbols $I_k$ and $Q_k$ used when transmitting into a channel, the filter circuit 960 uses the current tentative decisions appearing on output 980 to generate signals on its output 961 of the same kind as are received from the channel on input 910. The qualitative difference between those signals on input 910 and those on the output 961 of filter 960 is that the latter are free of distortion and noise introduced in the real channel.

The noiseless estimates of transmitted symbols are compared in comparator 950 with the actual received symbol information, which has been delayed by delay unit 920 for a period D' to account for the processing delay introduced by decoder 930 and estimator 960. The difference between the actual input and the noiseless estimate of such input has the nature of an error signal which is then used by channel tracking element 940 to adjust the values for the channel coefficients used by decoder 930. In general, the data used by the channel estimation and tracking algorithm by element 940, 950 and 960 may be different from the final decoder decisions $\tilde{C}_k$. Thus, input to the channel updating process on output 980 of decoder 930 is denoted by $C'_k$.

Trellis Algorithm

The use of an enhanced trellis search algorithm to effect decoding and equalization in accordance with the present invention will now be illustrated with reference to FIGS. 12–14. For purposes of this illustration, the significant intersymbol interference will again be assumed to extend to the two symbols prior to a currently processed symbol, i.e., M=2. That is, in addition to the output, $C_k$, of modulator at the transmitter for the symbol period corresponding to the "current" period of the received signal, there is a contribution to the channel output from the modulator output during the two periods preceding the modulator output for the current period. As noted earlier, this degree of channel "memory" is typical of channels encountered in practice in such contexts as cellular mobile telephone applications. FIG. 10 and the related description given above illustrate generally the memory effects for such a channel.

Thus, the T-spaced subchannel impulse responses for a two-subchannel context can be represented by $$h(0) = \{h_0(0), h_1(0), h_2(0)\}$$

and $$h(1) = \{h_0(1), h_1(1), h_2(1)\}. \quad (23)$$

For a given modulator output sequence $\{C_k\}$, the two T-spaced channel sequences, with a relative offset of T/2, are then given by $$s_{k+1}(0) = h_0(0)c_{k+1} + h_1(0)c_k + h_2(0)c_{k-1}$$

and $$s_{k+1}(1) = h_0(1)c_{k+1} + h_1(1)c_k + h_2(1)c_{k-1}. \quad (24)$$

As noted above, a straightforward application of the Viterbi algorithm in this context would compute the path with the lowest cost (or metric) into each state of a 16-state trellis using a dynamic programming procedure. For a symbol sequence of even modest length, the computations of the cumulative path metric for the range of symbol periods presents computational complexities that may be difficult to implement for some applications, such as a mobile cellular communication station.

Figure 14:
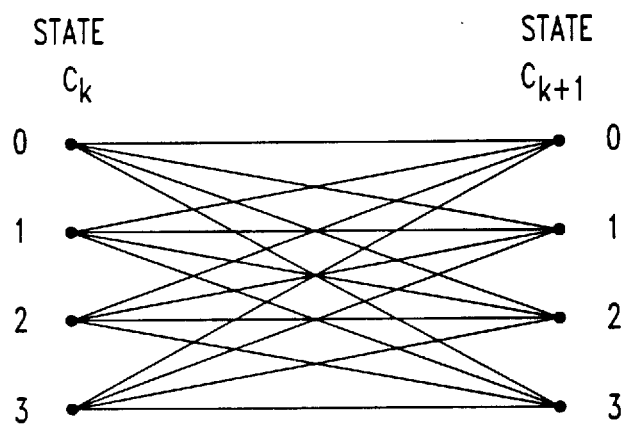
FIG. 14 shows a reduced-state trellis for use, in accordance with one aspect of the present invention, with a rapidly changing channel.

In order to reduce such complexity, while retaining a high degree of decoded symbol accuracy, an alternative four-state trellis of the type shown in FIG. 14 is defined in accordance with an aspect of the present invention where the states are determined only by a single symbol $c_k$. Thus, for the signaling alphabet of the typical IS-54 system, at time k–1, there are paths entering each of the four possible states $C_{k+1}$ from four predecessor states, $C_k$.

In FIG. 14, the states are identified by the index 0,1,2,3, again a shorthand for the actual symbol values. Specifically, 0 is either $e^{j0}$ or $e^{j\pi/4}$,
1 is either $e^{j\pi/2}$ or $e^{j3\pi/4}$,
2 is either $e^{j\pi}$ or $e^{j5\pi/4}$ and
3 is either $e^{j3\pi/2}$ or $e^{j7\pi/4}$. The channel output associated with a state transition $c_k \rightarrow c_{k-1}$ in FIG. 14 is determined from Eqs. (23). It will be noted that $c_{k-1}$, which is included in the evaluations of Eqs. (23) is not explicitly shown in the trellis of FIG. 14. In this respect, FIG. 14 differs from FIG. 11. In the determinations of Eqs. (23), the state $C_{k-1}$ is determined based on the best survivor (predecessor state) leading into state $C_k$ for each particular state at time k. So, for example, while determining the channel output associated with a transition to state 1 at time k+1 from state 2 at time k, the assumed state at time k–1 is that in the path having the best metric leading to into state 2 at time k. Thus, when evaluating metrics for paths leading into states at a time k, it proves convenient to retain the identity of the state at time k–1 that yields the best metric for each state at time k. So, for the 4-state trellis of FIG. 14, it proves convenient to retain for each state i (i=0,1,2,3) at time k the identity of the state from time k–1 that is in the path leading to state i at time k which path has the best metric.

It should be recognized that not all states at time k will ultimately be in the path having the best overall metric. Likewise, the assumed state at time k–1 leading to a state at time k may not be in the path finally selected as having the best overall metric. Nevertheless, for purposes of calculating the channel output with reduced complexity, the assumptions prove valuable.

Using these steps, the outputs for all transitions to each state at time k+1 are determined and the branch metrics are calculated according to $$J_{k+1} = |e_{k+1}(0)|^2 + |e_{k+1}(1)|^2 \quad (25)$$

where $$e_{k+1}(0) = r_{k+1}(0) - \sum_{i=0}^{2} c_{k+1-i} h_i(0)$$

and $$e_{k+1}(1) = r_{k+1}(1) - \sum_{i=0}^{2} c_{k+1-i} h_i(1).$$

The total cost (metric) for each of the four paths entering each state at time k+1 are evaluated and the path with the lowest cost is retained for each state at time k+1.

Figure 13:
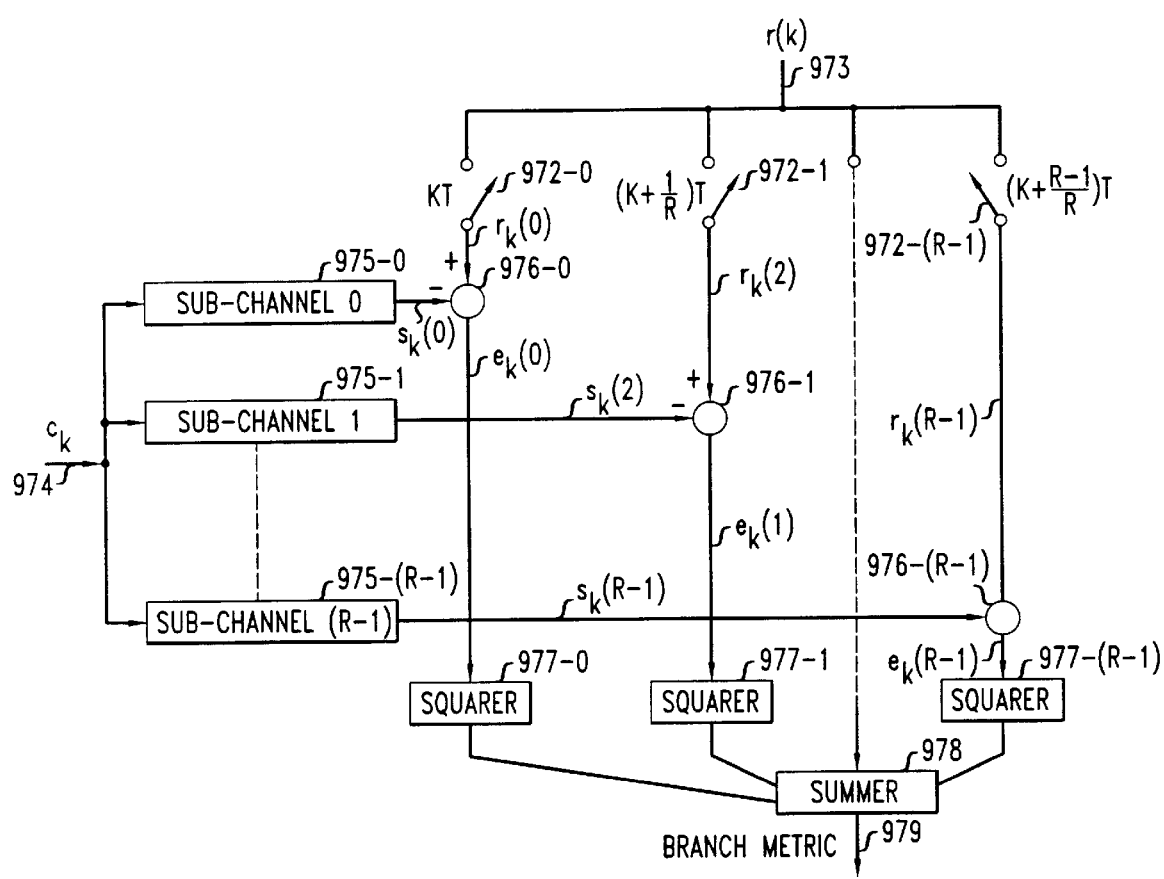
FIG. 13 is a block diagram of an arrangement for calculating branch metrics in accordance with an aspect of the present invention.

FIG. 13 is a block diagram of functionality for use in decoder 930 in FIG. 12 for computing branch metrics in accordance with Eqs. (24). Shown in FIG. 13 are subchannel units 975-l, l=0, 1, . . . , (R–1) for generating the $S_l(l)$ signals resulting from performing the convolution functions of Eqs. (23), based on stored estimates of subchannel coefficients, h, and transmitted symbol values $C_k$, appearing on input 974. Received values r(k) appearing on input 973 are sampled by samplers 972-l at respective multiples of 1/RT, with the result being compared in comparators 976-l with the output $S_k(l)$ from respective subchannel units 975-l. The output of each of the comparators 976-l is an error term that is then squared in corresponding squarers 977-l before being summed in summer 978. The outputs of summer 978 on lead 979 are the desired branch metric values.

Figure 15:
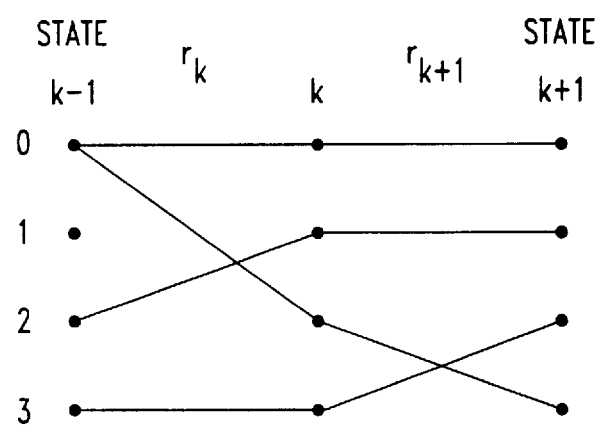
FIG. 15 is an example of a trellis of the type shown in FIG. 14, showing paths through the trellis used in calculating a minimum metric.

FIG. 15 is a typical trellis illustrating the reduced complexity of metric computation in accordance with the present invention. Thus, in computing the metric into each state at time k+1, only four possible states are used; these states at time k are identified as states 0,1,2 and 3, as in FIG. 14. The symbol value pairs for each state are again the alternating symbol values associated with that state for the case of an IS-54 system. Each branch metric is calculated in accordance with the teachings of FIG. 13, and more specifically for R=2, in Eqs. (25). For each state at time k+1, a metric for the branch leading from each state at time k is calculated.

However, in determining the value for $C_{k+1-i}$ when i=2 in the summations of Eq. (25), the value is chosen that yielded the minimum path metric leading into each state at time k. Thus in calculating the metric for the path extending from state 2 at time k to state 3 at time k+1, it is assumed that the corresponding symbol for the time k−1 (i.e., $C_{k-1}$) was that associated with state 0. Likewise, computations for other paths extending from state 2 at time k assume that the symbol at time k−1 was that associated with state 0. These assumptions are based on the determination that the path leading into state 2 at time k with the minimum metric is that coming from state 0.

The actual calculations performed which lead to the example results of FIG. 15 include those for all of the state transitions of FIG. 14, using Eqs. (25). As noted, the state at time k−1 associated with each state at time k (the state pair defining the minimum metric path leading to the state at time k) is conveniently stored for subsequent use in the course of computations required by Eqs. (25). The input values $C_k$ are stored in $C_k$ STORE 935, and values for channel estimating parameters are likewise conveniently stored, as represented by element 940 in FIG. 12. In the next section, the manner of updating the channel estimates will be treated.

The simplifications that follow from the reduced-state trellis and the assumptions regarding the prior states considerably reduce the complexity of the computations without corresponding sacrifice in the final symbol estimation.

Channel Adaption Algorithm

Two major problems associated with the use of conventional channel estimation techniques for rapidly changing channels are delay in channel updating and use of unreliable tentative data decisions. The adaptive channel updating algorithm in accordance with another aspect of the present invention avoids these problems.

In the context of the trellis algorithm described above and illustrated in FIGS. 12–15, and in the absence of errors, the correct path is available as the locally best estimate. That is, for each time k+1, one of the four illustrative states will have the path with minimum cost or metric leading to it. Further, such locally best estimates are available without delay. Thus, channel updating without delay advantageously can be performed by maintaining one channel estimate for each state.

This "zero-delay" channel updating also reduces the effect of error propagation. This is observed by noting that as long as the correct data sequence candidate is a locally best estimate (although not the current globally best), then that state has the correct channel (ideally) while the current globally best state will have an incorrect channel estimate (ideally). Then, the future metric growth for the incorrect state will be larger than that for the correct state since the former has an incorrect channel estimate. Thus the algorithm has a tendency to inhibit errors.

It should be noted that maintaining multiple channel estimates, one for each state, can also be incorporated into the conventional adaptive Viterbi algorithm. Such incorporation of one-per-state channel estimates will yield improvements as compared with conventional Viterbi processing especially at low signal-to-noise ratios and when the channel is changing rapidly. Maintaining multiple channel estimates in the presence of uncertain initial channel estimates or data decisions is described in U.S. Pat. No. 5,263,033 cited above. The use of multiple channel estimates has proven especially successful in the context of blind equalization and will be found to be robust to fades as well.

With the channel estimate at time k and for state m defined as $h_{k,m}<(l)$, where $1 \leq k-1$ as in Eq. (12), the multiple channel updating algorithm proceeds as follows:

1. Find the best path into each state at time k.
2. Update the channel estimate at time k for each state m as $$h_{k,m}^\dagger(l) = h_{k-1,i}^\dagger(l) + \Delta \cdot e_{k,m}(l) \cdot c_k^{*\dagger} \tag{26}$$

l=0,1 m,i=0, 1, 2, 3.

Here $h_{k-1,i}(l)$, l=0,1 are the T-spaced channel estimates at the best predecessor state for state m. The quantities $e_{k,m}(l)$, l=0, 1 are the corresponding error terms and are available as a part of the metric calculations performed by the above-described modified Viterbi algorithm. As noted in connection with the reduced complexity trellis algorithm, the $C_k$'s used in evaluating the errors are determined by state m, its predecessor state for i.

Channel Updating with a Leaky Predictor

The error term at time k that is used by the illustrative simplified trellis algorithm described above uses the channel estimates that are available at time k−1. In accordance with another aspect of the present invention, a simple predictor can be used to predict the channel parameters at time k, and can then use the predicted channel estimates in computing metrics.

For example, if the channel estimate for state i, i=0, 1, 2, 3 at time k−1 are $h_{k-1,i}$, then the predicted channel at time k for any path evolving from state i is given by $$h_{k,i}^{pred}(l) = \alpha h_{k-1,i}(l), l=0,1. \tag{27}$$

Here α is a constant smaller than unity. In applications such as a mobile telephone system, e.g., that covered in the IS-54 document, a value of about 0.95 is found to be robust for a wide range of vehicle speeds. The leaky predictor is found to be instrumental in lowering the error floor that occurs at high vehicle speeds. The channel vector $h_{k,i}^{pred}$ then enters Eq. (26) in place of $h_{k-1,i}(1)$. The simple predictor described in this section and defined in Eq. (26) should be understood to merely be illustrative; other particular predictors, including those of greater complexity known in related arts, may prove useful in particular applications of the present inventive teachings.

TYPICAL OPERATION

This section will describe typical operation of illustrative embodiments of the present invention and compare results of such operation with prior equalizer/decoders.

The delay interval is defined in the IS-54 Document as the difference in μsec between the first and second ray, where both rays are of equal magnitude, all in the sense of the two-ray model of FIG. 7. The following discussion conveniently refers to the delay interval in terms of the symbol period (T). Thus 1.25T refers to a delay of 1.25 times the symbol period. The effects of delay intervals varying from zero to more than one symbol interval, and of various vehicle speeds, can advantageously be evaluated for the present invention as compared to conventional Viterbi decoding.

In some cases, the well-known LMS technique referred to above is utilized for channel tracking in such prior equalizers and may also be used for some purposes in connection with the operation of equalizers in accordance with the illustrative embodiments of the present invention (e.g., at startup). In using such LMS algorithms, a step size of 0.14 provides good results. Decisions from Viterbi decoders are illustratively taken at a depth of 10 symbols into the trellis; other symbol depths may prove advantageous in particular circumstances.

An instantaneous channel estimation is not practical because of the processing required to derive channel characteristics. Because of this processing delay, a channel estimate derived is usually that for the channel as it existed at a time equal to one or more symbol intervals prior to the current symbol interval. At slow vehicle speeds, such lag of channel estimates will not present a major problem in systems like the IS-54 system, but the effects at higher vehicle speed (or other conditions causing rapid channel changes) can be significant.

If perfect channel estimation is assumed in the prior Viterbi equalizers for purposes of comparison with the equalizer of the present invention, it can be shown that the effect of a processing delay of 5T (i.e., five times the symbol period), is relatively slight at a vehicle speed of 20 miles per hour (mph) but that the effect increases to a moderate level at 60 mph. Further, if LMS channel tracking is assumed instead of perfect channel estimation, and correct decisions are fed back, performance degradation is more pronounced, especially at higher vehicle speeds, e.g., 60 mph.

In a real operating mode, a decision directed equalizer must use its own decisions for updating the channel estimate. The delay that accompanies such updating is typically a compromise between a longer delay which allows a more reliable Viterbi evaluation and a shorter delay in updating to account for rapid changes in the physical channel.

For further comparison purposes, the performance of a decision directed Viterbi equalizer using a standard LMS algorithm for startup and channel tracking can be shown to give its best error performance for a processing (updating) delay of 2 to 4 symbols at a vehicle speed of 20 mph. Thus a lower processing delay, say 1T, results in a considerable degradation except when the delays between the rays constituting the multipath fade are zero. Likewise, performance for larger processing delay, say 5T, shows relatively greater degradation despite the greater decision depth possible with the longer delay. The effect of the channel mismatch is clear. At 60 mph, a preferred channel updating delay can be shown to be approximately 2 symbol intervals (2T). The shorter delay can be seen to be of greater importance for the higher vehicle speed with its attendant faster changes in channel characteristics.

Comparison of the foregoing standard single-channel Viterbi equalizers with the illustrative multiple-subchannel equalizer in accordance with one aspect of the present invention shows improved performance by the latter under a variety of circumstances, especially at higher vehicle speeds, or under other conditions where the physical channel is changing rapidly. Further, by using the channel adaptation algorithm of the present invention, it is possible to obtain an improved channel estimate that proves especially important under conditions of rapid fading. While the advantages to be gained will vary in particular circumstances with the number of subchannels used, an illustrative number of four subchannels has proven effective with only moderate implementation complexity as will be understood from the above teachings.

Improved performance is also achieved using the above described leaky predictor feature of the present invention in channel tracking. The simple first order prediction approach described above not only provides reduced error rates, but also can improve the ability of the equalizer to recover from rapid fades. Values for the coefficient alpha in Eq. (27) from 0.90 to 0.97 or more have proven effective in particular circumstances. While particular ones of these and other values for alpha may prove advantageous under individual conditions of received signals, channel characteristics and processing delay, the value of 0.95 proves a good general purpose selection.

While operations have been described in terms of time intervals, e.g., T-second intervals, such intervals are meant only as relative periods or equivalent processing components. Thus, if data transmission or other non-real-time transmission is the subject of the decoding and equalization in accordance with the teachings of the present invention, then the associated processing can be performed at different rates or over different intervals as may suit the convenience or necessities of the context.

Figure 16:
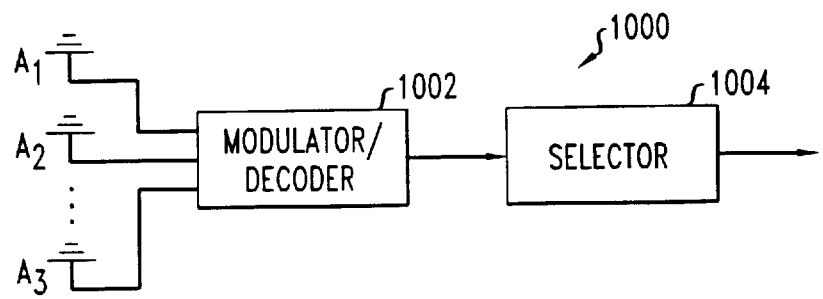
FIG. 16 is a block diagram representation of a communication system including a plurality of antennae employing the present invention.

FIG. 16 illustrates an exemplary block diagram representation of a communication system 1000 which may suitably be utilized for implementing the present inventive technique for exploiting the advantages of antenna diversity in order to obtain higher accuracy in the estimation of a transmitted signal, where the transmitted signal is a time varying signal representing a sequence of symbols. Referring to FIG. 16, the system 1000 comprises a plurality of receiving attennae $A_1$ to $A_n$. The attennae $A_1$ to $A_n$ each include an output which is connected to a decoder 1002. The decoder 1002 includes suitable circuitry, not shown, for processing the plurality of streams of samples of the transmitted signal which are provided by the plurality of antennae $A_1$ to $A_n$, respectively. The decoder 1002, preferably, performs demodulating and decoding functions for generating estimates of symbols actually transmitted, as they are received in the form of the transmitted signal at each of the attennae, in the same manner as described above for the demodulator block 40 and the decoder 50 for single channel, or single antenna, operation. It is to be understood that the decoder 1002 may suitably include a plurality of devices similar to the demodulator block 40 and the decoder 50. Alternatively, the decoder 1002 may include an integral device that performs the above described demodulation and decoding functions for multiple sampled streams and provides multiple demodulated and decoded outputs, respectively. The decoder 1002 is connected to a selector block 1004. The selector block 1004 includes circuitry, not shown, for selecting the best estimate of the transmitted signal, as explained in further detail with reference to FIG. 17.

Figure 17:
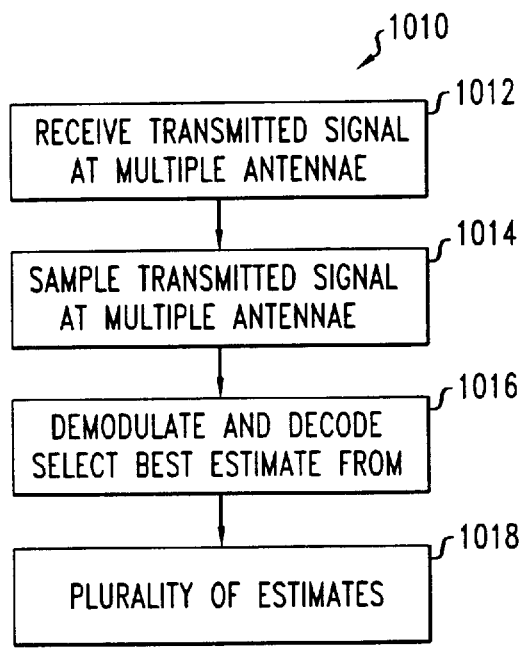
FIG. 17 is a flow diagram of a method for implementing the present inventive technique in the system shown in FIG. 16.

FIG. 17 is an exemplary flow diagram of a method 1010 for obtaining an estimate of a transmitted signal in accordance with the present inventive technique, where the transmitted signal is received using the system 1000. Referring to FIG. 17, in step 1012, each of the plurality of antennae $A_1$ to $A_n$ receive a time varying transmitted signal representing a sequence of symbols. In step 1014, each of the antennae sample the signal using conventional techniques for generating a set of samples representative of the signal. It is noted that conventional filtering may be performed at each of the antennae. A sampled signal stream for each antenna is then provided to the decoder 1002 for further processing.

In step 1016, the decoder 1002 suitably generates, for each of the sampled signal streams, a set of values which represent partial estimates of the sampled transmitted signal as received at each of the antennae using the demodulation and decoding techniques of the present invention which are described above. The selector 1004 then selects one single best estimate of the transmitted sequence by combining the sample signal streams from the multiple antennae, in step 1018. This may be illustrated as follows. The illustration assumes that there are two antennae and the T-spaced sub-channel impulse response for a two sub-channel context for antenna i, i=1,2, is $h^i(j)=\{h_0^i(j), h_1^i(j), h_2^i(j)\}$, where j=1,2. This assumes a memory span of two symbols. For a given modulator output sequence $\{C_k\}$, the two T-spaced channel sequenced symbols at k+1 for the $i^{th}$ antenna with a relative offset of T/2 are then $S^i_{k+1}(j)=h_0(j)C_{k+1}+h_1(j)C_k+h_2(j)C_{k-1}$, where j=1,2. The noisy received symbol is $r^i_{k+1}(j)=S^i_{k+1}(j)+n^i_{k+1}(j)$, where j=1,2. The metric at time k+1 is given by $$J_{k+1} = \sum_{i=1}^{2} [|e^i_{k+1}(0)|^2 + |e^i_{k+1}(1)|^2],$$

where $$e^i_{k+1}(j) = r_{k+1}(j) - \sum_{l=0}^{2} C_{k+1-l} h^i_l(j),$$

where i=1,2 and j=1,2.

For the single antenna case, the Viterbi algorithm and its variants as described herein can be used to accumulate the metric and the channel adaptation can be performed as described in the channel adaptation section.

While the above description has been presented, in part, in terms of processing operations characterized by one or more mathematical equations, it should be understood that the actual implementations will, as is well known to those skilled in the art, be realized in terms of either program controlled apparatus, such as an AT&T DSP 16A fixed-point signal processor or equivalent special purpose processing apparatus.

We claim:

1. A method for decoding a time varying signal representing a sequence of symbols having been supplied to a communications channel at a symbol rate, said method comprising the steps of:
   receiving said time varying signal at each one of a plurality of antennas;
   sampling said received time varying signal at a sampling rate of R/T, wherein R≧2, and generating a set of R sampled values representative of said sampled time varying signal at each of said plurality of antennas;
   generating locally a set of values for each one of a plurality of sets of candidate symbol sequences, each of said values representing at least a partial estimate of an output of said communications channel as received at least one of said plurality of antennas; and
   comparing each of said sample sets with one or more of said value sets and, in response thereto, selecting the sequence of symbols supplied to said communications channel and received at at least one of said plurality of antennas.

2. The method as set forth in claim 1 wherein said comparing step further includes the step of utilizing one or more multi-state trellises to generate said set of values for at least one of said plurality of sets of candidate symbol sequences.

3. The method as set forth in claim 2 wherein said utilizing step further includes the step of using a Viterbi algorithm.

4. The method as set forth in claim 2 wherein said utilizing step further includes the step of traversing said one or more multi-state trellises.

5. The method as set forth in claim 1 wherein said selectively comparing step further includes the step of forming an error signal reflecting a difference between at least a subset of said set of samples and a subset of said set of values for each of said candidate symbol sequences.

6. The method as set forth in claim 5 wherein said selectively comparing step further includes the step of selecting as a symbol supplied to said communications channel a symbol in the candidate symbol sequence yielding a minimum value for said error signal for said plurality of antennas.

7. The method as set forth in claim 2 further including the step of updating at least a portion of one or more of said multi-state trellises using a minimum value for said error signal.

8. The method as set forth in claim 1 wherein at least one particular candidate symbol sequence, which is representative of at least one output of said communications channel as received at at least one of said plurality of antennas, includes a plurality of symbols and said generating step further includes the step of producing a current value for a current symbol of said particular candidate symbol sequence, said current value affected by intersymbol interference caused by at least one symbol supplied to said communications channel prior to said current symbol.

9. The method as set forth in claim 8 wherein said producing step further includes the step of using at least a first prior value at a time k−1 and at least a second prior value at a time k to generate said current value for said current symbol at a time k+1.

10. The method as set forth in claim 5 wherein said generating step further includes the step of determining each of said partial estimates of said output of said communications channel based on a respective partial estimate of characteristics of said communications channel.

11. The method as set forth in claim 10 further including the step of updating said partial estimates of the characteristics of said communications channel in response to said error signal.

12. The method as set forth in claim 11 wherein said error signal is determined by determining a difference between each of said set of samples for at least one of said plurality of antennas and a noiseless estimate of the channel output.

13. The method as set forth in claim 12 wherein said noiseless estimate of the channel output is generated in response to a tentative decision as to the symbol actually supplied to said communications channel.

14. The method as set forth in claim 13 further including the step of updating each of said partial estimates of the characteristics of said communications channel in response to a signal representing a prediction based on the current estimates of said characteristics of said communications channel.

15. A decoder for decoding a time varying signal representing a sequence of symbols having been supplied to a communications channel at a symbol rate, said decoder comprising:
   a plurality of antennas operative to receive said time varying signal; and
   a circuit coupled with said plurality of antennas and operative to:
      sample said received time varying signal at a sampling rate of R/T wherein R≧2, and generate a set of R sampled values representative of said sampled time varying signal at each of said plurality of antennas;

generate a set of values for each one of a plurality of sets of candidate symbol sequences, each said value representing at least a partial estimate of an output of said communications channel as received at at least one of said plurality of antennas; and compare each of said sample sets with one or more of said value sets and, in response thereto, select the sequence of symbols supplied to said communications channel and received at at least one of said plurality of antennas.

16. The decoder as set forth in claim 15 wherein said circuit is further operative to utilize one or more multi-state trellises to generate said set of values for at least one of said plurality of sets of candidate symbol sequences.

17. The decoder as set forth in claim 15 wherein said circuit is further operative to use a Viterbi algorithm.

18. The decoder as set forth in claim 16 wherein said circuit is further operative to traverse said one more multi-state trellises.

19. The decoder as set forth in claim 16 wherein said circuit is further operative to form an error signal reflecting a difference between at least a subset of said set samples and a subset of said set of values for each of said candidate symbol sequences.

20. The decoder as set forth in claim 19 wherein said circuit is further operative to select as a symbol supplied to said communications channel a symbol in the candidate symbol sequence yielding a minimum value for said error signal for said plurality of antennas.

21. The decoder as set forth in claim 19 wherein said circuit is further operative to update at least a portion of one or more of said multi-state trellises using a minimum value for said error signal.

22. The decoder as set forth in claim 15 wherein at least one particular candidate symbol sequence, which is representative of at least one output of said communications channel as received at at least one of said plurality of antennas, includes a plurality of symbols and said circuit is further operative to produce a current value for a current symbol of said particular candidate symbol sequence, said current value affected by intersymbol interference caused by at least one symbol supplied to said communications channel prior to said current symbol.

23. The decoder as set forth in claim 22 wherein said circuit is further operative to use at least a first prior value at a time k−1 and at least a second prior value at a time k to generate said current value for said current symbol at a time k+1.

24. The decoder as set forth in claim 19 wherein said circuit is further operative to determine each of said partial estimates of said output of said communications channel based on a respective partial estimate of characteristics of said communications channel.

25. The decoder as set forth in claim 24 wherein said circuit is further operative to update said partial estimates of the characteristics of said communications channel in response to said error signal.

26. The decoder as set forth in claim 25 wherein said circuit is further operative to determine said error signal by determining a difference between each of said set of samples for at least one of said plurality of antennas and a noiseless estimate of the channel output.

27. The decoder as set forth in claim 26 wherein said noiseless estimate of the channel output is generated in response to a tentative decision as to the symbol actually supplied to said communications channel.

28. The decoder as set forth in claim 27 wherein said circuit is further operative to update each of said partial estimates of the characteristics of said communications channel in response to a signal representing a prediction based on the current estimates of said characteristics of said communications channel.

* * * * *